US011990826B2

(12) United States Patent
Mueller

(10) Patent No.: US 11,990,826 B2
(45) Date of Patent: May 21, 2024

(54) POWER ELECTRONICS DEVICE AND METHOD FOR SUPPLYING ELECTRICAL VOLTAGE TO A DRIVER CIRCUIT OF A POWER SEMICONDUCTOR SWITCH

(71) Applicant: SMA Solar Technology AG, Niestetal (DE)

(72) Inventor: Burkard Mueller, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 345 days.

(21) Appl. No.: 17/410,225

(22) Filed: Aug. 24, 2021

(65) Prior Publication Data
US 2021/0384824 A1    Dec. 9, 2021

Related U.S. Application Data

(63) Continuation of application No. PCT/EP2020/052618, filed on Feb. 3, 2020.

(30) Foreign Application Priority Data

Feb. 25, 2019 (DE) .................... 10 2019 104 652.1

(51) Int. Cl.
*H02M 3/158* (2006.01)
*H02M 1/00* (2006.01)
(52) U.S. Cl.
CPC ................................. *H02M 1/0006* (2021.05)
(58) Field of Classification Search
CPC ................................ H02M 1/0006; H02M 1/08
See application file for complete search history.

(56) References Cited

U.S. PATENT DOCUMENTS

| | | | |
|---|---|---|---|
| 8,558,584 B2 * | 10/2013 | Draxelmayr | H02M 7/538 |
| | | | 327/108 |
| 2010/0066175 A1 | 3/2010 | Jansen | |
| 2017/0222573 A1 * | 8/2017 | Granig | H02M 3/335 |
| 2018/0145668 A1 | 5/2018 | Chan | |
| 2018/0167063 A1 | 6/2018 | Akahane | |

FOREIGN PATENT DOCUMENTS

CH            699884 A2    5/2010

OTHER PUBLICATIONS

International Search Report dated Apr. 9, 2020 in connection with PCT/EP2020/052618.

* cited by examiner

*Primary Examiner* — Alex Torres-Rivera
(74) *Attorney, Agent, or Firm* — Eschweiler & Potashnik,

(57) ABSTRACT

A power electronics device has a first power semiconductor switch and a driver circuit and enables a supply of electrical voltage to a driver circuit. An auxiliary circuit arrangement has a supply capacitor, an auxiliary capacitor, a normally off auxiliary semiconductor switch, a diode and a bootstrap diode. The auxiliary semiconductor switch is connected to a reference potential connection of the first power semiconductor switch via a connection point, starting from the connection point, a series connection of the diode, a second connection point and the auxiliary capacitor is arranged in parallel with the auxiliary semiconductor switch. When the auxiliary semiconductor switch is in the off state, the auxiliary capacitor is charged by the flow of current through the first power semiconductor switch.

17 Claims, 6 Drawing Sheets

POWER ELECTRONICS DEVICE AND METHOD FOR SUPPLYING ELECTRICAL VOLTAGE TO A DRIVER CIRCUIT OF A POWER SEMICONDUCTOR SWITCH

CROSS REFERENCE TO RELATED APPLICATIONS

This application is a continuation of International Patent Application number PCT/EP2020/052618, filed on Feb. 3, 2020, which claims priority to German Patent Application number 10 2019 104 652.1, filed on Feb. 25, 2019, and is hereby incorporated by reference in its entirety.

FIELD

The disclosure relates to a power electronics device, in particular to a power converter, having at least one first power semiconductor switch. In order to drive the first power semiconductor switch, the power electronics device also comprises a driver circuit. The disclosure also relates to a method for supplying electrical voltage to a driver circuit of a power semiconductor switch.

BACKGROUND

A power electronics device may be, for example, a buck converter, a boost converter, a boost/buck converter, or an inverter. Such power converters include power semiconductor switches that are switched accordingly by the power converter to convert a voltage present on the input side. In order to drive the power semiconductor switches, a control signal is applied to a control input of the respective power semiconductor switch. The control input may, for example, be a gate connection of an IGBT (Insulated-Gate Bipolar Transistor) or of a MOSFET (Metal-Oxide Semiconductor Field-Effect Transistor). Integrated circuits—which may also be referred to as clock generators or signal generators—for example microprocessors, are often used to generate drive signals for power semiconductor switches. The output currents or output voltages provided by these integrated circuits are, however, in most cases not sufficient to drive a power semiconductor switch directly. Driver circuits are therefore applied between the clock generator and the power semiconductor switch, these driver circuits generate a control signal of sufficient current and voltage from the drive signal of the clock generator and make the control signal available, at a driver output, to a control input of the power semiconductor switch. The drive signal and the control signal may be a so-called pulse-width-modulated drive/control signal, wherein the pulse pattern of the drive/control signal can be generated in the clock generator by way of a modulation variable and a control variable. The modulation variable may have a periodic, triangular or sawtooth-shaped voltage profile and the control variable may be constant at a voltage value corresponding to the control variable. The pulse pattern of the pulse-width-modulated drive signal may be generated through comparison between the control variable and the modulation variable, with the clock generator being controlled according to a current operating state of the power converter in terms of a frequency and magnitude of the modulation variable and a magnitude of the control value, for example, by a controller of the power converter. As an alternative, the control signal may also have a fixed duty cycle, be generated via subordinate current control (current mode) or be generated in some other way depending on switching thresholds and/or fixed on or off times, wherein the switching frequency may also be variable. The clock generator and the driver circuit may be installed in a common component. In order to protect them, or for a reverse-conducting function, the power semiconductor switches may each have a body diode or comprise a diode, the polarity of which corresponds to a body diode.

Both during operation and upon startup of the electrical device, the necessary components, in the case of a power converter, for example, the controller of the power converter and driver circuits of its power semiconductor switches, have to be supplied with electric power. Upon startup of a power converter, for example, a DC voltage may be applied at least between a first and a second connection of an input of the power converter, which DC voltage is provided, for example, by a DC generator such as a photovoltaic module or a series connection (string) of such modules. A DC voltage applied in this way may be used, for example, to supply necessary components upon startup.

SUMMARY

The present disclosure relates to the supply of electrical voltage to at least one driver circuit of the power electronics device. The present disclosure also relates to a method for supplying electrical voltage to a driver circuit of a power semiconductor switch. Such driver circuits for power semiconductor switches, such as, for example, MOSFETs or IGBTs, require a voltage supply of usually 10 to 20 volts, related to the potential of the reference potential connection of the power semiconductor switch. The reference potential connection is, for example, an emitter connection in the case of a bipolar transistor or IGBT or a source connection in the case of a MOSFET. Driver circuits for power semiconductor switches, which have to work even before startup of an on-board power supply of a power converter or are part of the on-board power supply, are particularly difficult to supply.

It is conceivable to charge a supply capacitor of a clock generator with an integrated driver circuit (PWM controller) via a high-resistance resistor from the input voltage of a power converter embodied as a flyback converter, and to limit the capacitor voltage via a parallel Zener diode. The efficiency of this arrangement can be poor, since, with an input voltage of, for example, 400V and a required driver voltage of 15V, an efficiency of only 15V/400V=3.8% is achieved. This arrangement is therefore typically suitable only for the startup of the flyback converter.

The disclosure is directed to a power electronics device, a power converter, and a method, by way of all of which it is made possible to supply electrical voltage to at least one driver circuit of a power semiconductor switch in a manner that is suitable at least for one operating mode of the power electronics device or the power semiconductor switch.

The disclosure, in one embodiment, is directed to a power electronics device that comprises an electrical auxiliary circuit arrangement for the supply of electric voltage to the driver circuit, wherein the auxiliary circuit arrangement comprises a supply capacitor and an auxiliary capacitor, a normally off auxiliary semiconductor switch, a diode and a bootstrap diode. In this case, the auxiliary semiconductor switch is connected to a reference potential connection of the first power semiconductor switch via a first connection point. Starting from the first connection point, a series connection of the diode, a second connection point and the auxiliary capacitor is arranged in parallel with the auxiliary semiconductor switch such that, when the auxiliary semiconductor switch is in the off state, the auxiliary capacitor is charged by the flow of current through the power semiconductor switch. For its electrical voltage supply, the driver circuit is connected to the supply capacitor and the supply capacitor is electrically connected by a first connection to the second connection point via the bootstrap diode and by a second connection to the reference potential connection. Thus, when the auxiliary semiconductor switch is in the on state and the auxiliary capacitor is at least partially charged, the supply capacitor is charged by the auxiliary capacitor via the bootstrap diode.

The disclosure, in one embodiment, is directed to a power electronics device with an auxiliary circuit that comprises an auxiliary switch that is integrated into a main circuit for a main function of the power electronics device. By way of example, a main function of a power converter is that of rectifying current. The auxiliary switch in this case serves to supply electric power to the driver circuit of the first power semiconductor switch and possibly further driver circuits of further power semiconductor switches, and, in one embodiment, has no or essentially no influence on the main function of the power electronics device or the power converter, in contrast to the first power semiconductor switch serving the main function. The time periods in which the auxiliary switch is closed—i.e. in the on state—in order to charge the supply capacitor from the auxiliary capacitor do not interfere with this main function of the power electronics device or the power converter in any case, since the auxiliary switch in the on state essentially behaves like a section of an electrical connection. Upon startup of the power electronics device or the power converter—that is to say during a starting process of the deactivated power electronics device or the power converter, a DC voltage is applied to the first power semiconductor switch between the reference potential connection and the further main connection of the first power semiconductor switch, for example, because a DC voltage from a DC generator is applied to an input of the power electronics device. Upon startup, the auxiliary switch does not interfere with a main function of the power electronics device or the power converter per se, since this is not yet present during startup. During operation of the power electronics device or the power converter, the first power semiconductor switch is switched at high frequencies, in one embodiment. If the first power semiconductor switch is in the off state—that is to say not in the on state—then the auxiliary switch behaves, depending on its switching state, either like a section of an electrical connection or like the first power semiconductor switch itself, such that a main function of the power electronics device or the power converter is not influenced, independent of the respective switching state of the auxiliary switch. If the first power semiconductor switch is closed—that is to say in the on state—then the current of the power path of the main circuit flows through the first power semiconductor switch, the main circuit not being significantly influenced by the charging of the auxiliary capacitor due to the low energy demand for the driver circuit and, due to its current, keeps the time intervals in which the auxiliary switch is in the off state low enough that the main function is not significantly influenced.

Upon startup, the auxiliary capacitor may be charged via the first power semiconductor switch and the first diode, wherein the first power semiconductor switch may be normally on or normally off. In both cases, the first power semiconductor switch may have a leakage current in the off switching state. Usually, the first power semiconductor switch is normally off and, in the off switching state, has a leakage current when an electrical voltage is applied between the two main connections of the power semiconductor switch, that is to say the reference potential connection and the further main connection of the power semiconductor switch. A leakage current is a residual current that still flows through the component when the power semiconductor switch is switched off, provided that an appropriate voltage is present. This residual current flows in the regular flow direction through the power semiconductor switch or in the reverse direction through a body diode of the power semiconductor switch or a supplementary diode included in the power semiconductor switch and having the same polarity as a body diode. During operation of the power electronics device or the power converter, the auxiliary capacitor may likewise be charged via a leakage current of the first power semiconductor switch during the time periods when the first power semiconductor switch is in the off state, and during the time periods during operation when the first power semiconductor switch is in the on state, by way of a proportion of the current flowing regularly through the first power semiconductor switch. Each time the auxiliary semiconductor switch is switched on, the auxiliary capacitor releases at least part of its charge to the supply capacitor, such that the actual driver circuit can be supplied therefrom. In order to shorten a charging time of the supply capacitor upon startup, a startup resistor may additionally be arranged such that an additional charging current is provided for the supply capacitor and the auxiliary capacitor. One connection of the startup resistor may for example be electrically connected to the further main connection of the first power semiconductor switch, and a second connection of the startup resistor may be electrically connected to the first connection of the supply capacitor of the driver circuit.

According to the disclosure, electrical voltage is thus supplied to the driver circuit of the first power semiconductor switch by charging the supply capacitor from the auxiliary capacitor, wherein the auxiliary capacitor is charged during operation of the power electronics device or the power converter by way of the current that flows through the first power semiconductor switch (leakage current or current when the first power semiconductor switch is in the on state). Thus, the power electronics device according to the disclosure or the power converter according to the disclosure make it possible to supply voltage to the driver circuit of the first power semiconductor switch, the voltage supply being suitable, due to its good efficiency, both for startup and for operation of the power electronics device or the power converter.

To illustrate the integration of the auxiliary switch of the auxiliary circuit arrangement into a main circuit comprising the first power semiconductor switch for a main function of a power converter, the power converter according to one embodiment may have an input and an output, wherein a third connection point is electrically connected to a first connection of the input and a fourth connection point is connected to a second connection of the input, wherein a first connecting branch extends from the third to the fourth connection point. Starting from the third connection point, according to the embodiment, the first connecting branch comprises the first power semiconductor switch, the first connection point and the normally off auxiliary switch in series. According to the embodiment, a second electrical connecting branch extends from the fourth to a fifth connection point and comprises, starting from the fourth connection point, the auxiliary capacitor, the second connection point, the diode, the first connection point and the supply capacitor in series, wherein the fifth and second connection point are electrically connected in parallel with the second connecting branch via the bootstrap diode. According to the embodiment, the power converter additionally comprises a driver circuit electrically connected to the control input of the first power semiconductor switch at a driver output, which driver circuit is connected in parallel with the supply capacitor for its voltage supply. According to the embodiment, the power converter may also comprise a comparator circuit connected to the control input of the auxiliary switch by a comparator output, which comparator circuit is configured to provide a control signal at its comparator output based on a charging voltage of the auxiliary capacitor. A forward direction of the diode is arranged such that, in at least one first operating state of the power converter, the auxiliary capacitor is charged via the diode and the first power semiconductor switch when the auxiliary switch is in the off state, and a forward direction of the bootstrap diode is arranged such that, in at least one second operating state when the auxiliary switch is in the on state, the supply capacitor is charged by the auxiliary capacitor via the bootstrap diode.

There may be provision in one embodiment that the auxiliary circuit arrangement comprises a drive circuit that is configured to provide a control signal for switching the auxiliary semiconductor switch at a control input of the auxiliary semiconductor switch based on a charging voltage of the auxiliary capacitor.

The drive circuit may obtain its own voltage supply from the auxiliary capacitor, since the auxiliary switch is normally off and the auxiliary capacitor may thus initially be charged via the first power semiconductor switch, and a control signal has to be provided by the drive circuit at the control input of the auxiliary switch only in order to charge the supply capacitor from the auxiliary capacitor. The auxiliary switch may be closed when the auxiliary capacitor is charged to a voltage that is sufficient to supply the driver circuit, and may be opened again (hysteresis) at a lower charging voltage, such that the auxiliary capacitor supplies the supply capacitor for the driver circuit of the first power semiconductor switch, via the bootstrap diode in accordance with the bootstrap principle, whenever the auxiliary switch is in the on state. The auxiliary circuit arrangement may be configured such that, after the first power semiconductor switch has been put into the on state for the first time, the supply capacitor is charged and supplies the driver circuit, such that, when the first power semiconductor switch is clocked, higher currents flow through the auxiliary circuit and the auxiliary capacitor and the supply capacitor are continuously recharged. The drive circuit may in particular be configured such that, when the charging voltage of the auxiliary capacitor exceeds a first threshold value, the drive circuit provides a control signal that puts the auxiliary switch into the on state at its control input. The first threshold value may correspond to or substantially correspond to a supply voltage of the driver circuit. In the context of this application, the term "supply voltage of the driver circuit" is not intended to mean a voltage applied to the driver circuit or the voltage provided by the supply capacitor for the driver circuit, but rather is intended to mean a voltage value that is suitable for driving the first power semiconductor switch due to the components used by the driver circuit. A supply voltage of the driver circuit may for example be between a component-induced minimum supply voltage and a component-induced maximum supply voltage of the driver circuit or be a component-induced predefined voltage value, and in particular a voltage value appropriately selected on the basis of the first power semiconductor switch for supplying the driver circuit. Since the auxiliary switch and the auxiliary circuit arrangement are protected from an excessively high voltage when the first threshold value is reached by way of the auxiliary switch being put into the on state, all of the components of the auxiliary circuit arrangement may be configured only for this lower voltage, such that it is possible to use inexpensive components for the auxiliary circuit arrangement.

In one embodiment, the drive circuit is configured to provide a control signal that puts the auxiliary semiconductor switch into the on state at the control input of the auxiliary semiconductor switch when a charging voltage of the auxiliary capacitor exceeds a first threshold value, and to provide a control signal that puts the auxiliary semiconductor switch into the off state at the control input of the auxiliary semiconductor switch when a charging voltage of the auxiliary capacitor falls below a second threshold value that is lower than the first threshold value, wherein the first threshold value corresponds at least to a supply voltage of the driver circuit.

Since the auxiliary switch is a normally off auxiliary switch, a blocking control signal may, for example, also be a non-existent control signal, in one embodiment. In the context of the disclosure, this is also referred to as a "blocking control signal". In other words, when a charging voltage of the auxiliary capacitor falls below a second threshold value, the drive circuit may also provide no control signal at the control input of the auxiliary semiconductor switch, since this—depending on the switch type—may likewise have a blocking effect on the auxiliary semiconductor switch. Therefore, in one embodiment, the term "switching into the on state" denotes a control signal that puts the auxiliary semiconductor switch in a closed switch state, that is to say into a conductive switch state, such that the supply capacitor is charged by the auxiliary capacitor.

In one embodiment, the first threshold value may correspond at least to the voltage value of a supply voltage of the driver circuit of the first power semiconductor switch. With regard to the meaning of the term "supply voltage to the driver circuit", reference is made to the above explanations. The first threshold value may, for example, be equal to or slightly higher (for example higher by a forward voltage of the bootstrap diode) than this supply voltage, such that, during operation, when the supply capacitor is charged by the auxiliary capacitor, essentially the supply voltage for the driver circuit arises at the supply capacitor. In one embodiment, the drive circuit of the power electronics device has a hysteresis function that avoids instability of the switching behavior of the auxiliary switch when the supply capacitor is charged by the auxiliary capacitor.

According to one embodiment of the disclosure, the drive circuit may be a two-level regulator, for example, a comparator circuit, a monoflop or a PWM controller, or a frequency controller.

In one embodiment of the disclosure, the circuitry may be implemented with standard components. By way of example, the comparator circuit may comprise a conventional comparator with an inverting and a non-inverting input and an output—which is connected to the control input of the auxiliary switch. For hysteresis behavior, a positive feedback resistor is incorporated electrically between the output of the comparator and the non-inverting input in one embodiment.

In one embodiment, the drive circuit is configured and electrically connected to the auxiliary capacitor such that the drive circuit is supplied with electrical voltage by way of the auxiliary capacitor.

The electrical supply to the drive circuit through the auxiliary capacitor is efficient. By way of example, the drive circuit may be connected in parallel with the auxiliary capacitor. In the case of the design as a comparator circuit, the drive circuit may comprise a comparator that is connected in parallel with the auxiliary capacitor at two supply connections. The charging voltage of the auxiliary capacitor may be applied to the non-inverting input of the comparator via circuitry, and a reference voltage may be applied to the inverting input of the comparator. By way of example, by virtue of a series connection comprising a Zener diode in the reverse direction, an eighth connection point and a resistor is arranged in parallel with the auxiliary capacitor, the non-inverting input of the comparator is connected to the eighth connection point and the inverting input of the comparator is connected to a reference potential.

In one embodiment the auxiliary semiconductor switch has the same polarity as the first power semiconductor switch.

In one embodiment, the first power semiconductor switch is configured to be normally off and, in the off switching state, has a leakage current when an electrical voltage is applied between the reference potential connection and a further main connection of the first power semiconductor switch.

In one embodiment, the first power semiconductor switch has a reference potential connection, a further main connection and a control input. As one embodiment of a normally off first power semiconductor switch, the first power semiconductor switch may be embodied as an n-channel MOSFET and the reference potential connection may be the source connection of the MOSFET and the further main connection may be the drain connection of the MOSFET.

In an alternative embodiment of the disclosure, the first power semiconductor switch may be configured to be normally off and a startup resistor may be included. The startup resistor may be connected by a first connection to the further main connection of the first power semiconductor switch and by a second connection to a connection of the supply capacitor.

If the normally off first power semiconductor switch has a leakage current, the startup resistor may shorten a startup time. If the normally off first power semiconductor switch has no leakage current, the startup resistor enables the supply capacitor and the auxiliary capacitor to be charged upon startup, such that, when the auxiliary semiconductor switch is in the off state, the auxiliary capacitor is charged upon startup by the flow of current through the startup resistor and subsequently during operation by the flow of current through the first power semiconductor switch.

In one embodiment of the auxiliary circuit arrangement, the auxiliary semiconductor switch serves exclusively to supply at least one driver circuit.

This embodiment of the disclosure serves to clarify that the auxiliary switch in one example has no or essentially no influence on the main function of the power electronics device or the power converter, in the same way as the first power semiconductor switch serving the main function. Although the auxiliary switch is integrated into a main circuit for the main function of the power electronics device, it is therefore not included in the power semiconductor switches of the power electronics device or the power converter, these being arranged and configured, in the case of the power converter, to perform the main current-rectifying function of the power converter.

In one embodiment of the disclosure the driver circuit is configured to be integrated with a clock generator, wherein the clock generator is configured to generate a pulse pattern of the control signal provided by the driver circuit.

This reduces the space required for the components as well as the manufacturing costs of the power electronics device.

In an alternative embodiment, the pulse pattern may be generated in another part of the circuit and supplied to the driver circuit either directly or with galvanic isolation (for example, via an optocoupler).

In one embodiment, the power electronics device comprises a half-bridge that, starting from a third connection point, comprises a series connection consisting of a high-side power semiconductor switch, a branch point and a low-side power semiconductor switch and a fourth connection point, wherein the low-side power semiconductor switch is designed as a first power semiconductor switch, wherein the power electronics device is in particular a DC/DC converter or an inverter.

In one embodiment, the auxiliary switch is arranged together with the first power semiconductor switch above or below the branch point. According to one embodiment of the disclosure, the power electronics device comprises at least one auxiliary circuit arrangement for the supply of electrical voltage to the driver circuit for driving the low-side power semiconductor switch. This enables the supply of electrical voltage to the driver circuit of the low-side power semiconductor switch upon startup and during operation. The power electronics device may comprise a startup resistor that is connected by a connection to the third connection point or the branch point and is connected by a further connection to the first connection of the supply capacitor of the auxiliary circuit arrangement for the supply of electrical voltage to the driver circuit for driving the low-side power semiconductor switch.

If the power converter is an inverter, this may be, for example, a single-phase inverter and comprise a full-bridge (so-called H-bridge) comprising two half-bridges, wherein a choke is connected downstream of one or both branch points. The inverter may, for example, also be a three-phase inverter and comprise a half-bridge for each phase, wherein a choke is connected in each case downstream of the three branch points. If the power converter is a bidirectional DC/DC converter, it may comprise a half-bridge downstream of the branch point of which a choke is connected. With a half-bridge, it is possible to set a voltage independently of the direction of the current. Energy may thus be transmitted in both directions. The term input and output of the power converter is thus chosen arbitrarily where applicable. With regard to an inverter, in one embodiment the input is arranged on and referred to as the DC side, and the output is arranged on and referred to as the AC side. In order to supply electrical voltage to the driver circuits of the low-side power semiconductor switches of the inverter, according to one embodiment of the disclosure, a separate auxiliary circuit arrangement and a separate auxiliary switch may be included for each low-side power semiconductor switch.

In one embodiment a link circuit is included, having an electrical connection connecting the third connection point to the fourth connection point via one or more series-connected or parallel-connected link circuit capacitors.

Furthermore, in one embodiment both the high-side power semiconductor switch and the low-side power semiconductor switch each comprise a driver circuit for driving the respective power semiconductor switch and each comprise a separate electrical auxiliary circuit arrangement for the supply of electrical voltage to the driver circuit. In such an embodiment, both the high-side and the low-side power semiconductor switch are each configured as a first power semiconductor switch.

In an alternative embodiment, a driver circuit is included for driving the high-side power semiconductor switch and a supply capacitor is included in order to supply electrical voltage to this driver circuit. The supply capacitor is electrically connected by a connection to a reference potential connection of the high-side power semiconductor switch and is electrically connected by a further connection to the first connection of the supply capacitor included in the auxiliary circuit arrangement via a further bootstrap diode in order to supply electrical voltage to the driver circuit for driving the low-side power semiconductor switch.

In one embodiment, the high-side and the low-side power semiconductor switch are normally off and, in the off switching state, have a leakage current when an electrical voltage is applied between their reference potential connection and their further main connection.

In another embodiment, a method for supplying electrical voltage to a driver circuit is disclosed, by way of which it is made possible to supply electrical voltage to at least one driver circuit of a power semiconductor switch in a manner that is suitable at least for one operating mode of the power semiconductor switch.

For this purpose, the driver circuit is supplied with voltage by a supply capacitor, wherein an auxiliary capacitor is charged by way of a current flowing through the power semiconductor switch during an off switching state of a normally off auxiliary switch in order to charge the supply capacitor. The supply capacitor is charged by the auxiliary capacitor when the normally off auxiliary switch is in the on state.

The auxiliary capacitor may thus be charged via all or part of a current flowing through the power semiconductor switch, such that the charging of the auxiliary capacitor is energy-efficient. The electrical energy stored in this way in the auxiliary capacitor may be used at least in part to supply the supply capacitor and thus ultimately to drive the power semiconductor switch, and may also be used, for example, to drive the auxiliary switch or to supply at least one further supply capacitor of at least one further driver circuit. The current flowing through the power semiconductor switch may be, for example, a leakage current upon startup or an operating current during operation of the power semiconductor switch, such that the method is suitable both for startup and for operation of the power semiconductor switch. The power semiconductor switch may also be referred to as the first power semiconductor switch. The method may be performed using such a device, wherein the power semiconductor switch used in the method is a first power semiconductor switch of the device.

In one embodiment, the normally off auxiliary switch is connected to a reference potential connection of the power semiconductor, such that, in a first act, when the auxiliary switch is in the off state, at least part of the current flowing through the power semiconductor switch is diverted to the auxiliary capacitor and at least partially charges the same. In a second act, the auxiliary switch is put into the on state and releases at least part of the charge of the auxiliary capacitor to the supply capacitor. In a third act, the auxiliary switch is put back into an off switching state, such that electric power is supplied to the supply capacitor by repeating the three acts multiple times, in order to supply the driver circuit during operation.

There may advantageously also be provision that the auxiliary switch is put into the on state based on a charging voltage of the auxiliary capacitor.

In one embodiment, this procedure is independent of a present value of the current flowing through the power semiconductor switch and is therefore suitable both for a startup and for operation of the power semiconductor switch.

In one embodiment, the auxiliary switch is put into the on state when a charging voltage of the auxiliary capacitor exceeds a first threshold value and the auxiliary switch is put into the off state when the charging voltage of the auxiliary capacitor falls below a second threshold value, wherein the second threshold value is lower than the first threshold value.

In one embodiment the method enables the supply capacitor to be charged by the auxiliary capacitor while the switching behavior of the auxiliary switch is stable at the same time. The first threshold value may correspond at least to the voltage value of a supply voltage of the driver circuit of the power semiconductor switch. In one example, the first threshold value may be equal to or slightly higher than the voltage value of the supply voltage, such that, during operation, when the supply capacitor is charged by the auxiliary capacitor, essentially the supply voltage for the driver circuit arises at the supply capacitor. In the context of one embodiment of the application, the term "supply voltage of the driver circuit" is not intended to mean a voltage applied to the driver circuit or the voltage provided by the supply capacitor for the driver circuit, but rather is intended to mean a voltage value that is suitable for driving the power semiconductor switch due to the components used by the driver circuit. A supply voltage of the driver circuit may, for example, be between a component-induced minimum supply voltage and a component-induced maximum supply voltage of the driver circuit or be a component-induced predefined voltage value, and in particular a voltage value appropriately selected on the basis of the power semiconductor switch for supplying the driver circuit.

This allows electrical voltage to be supplied to at least the driver circuit of the first power semiconductor switch in an energy-efficient manner, both upon startup and during operation of the device.

BRIEF DESCRIPTION OF THE DRAWINGS

Further embodiments and advantages of the disclosure are the subject matter of the description of embodiments of the disclosure with reference to the figures of the drawing, the same reference signs referring to functionally identical components.

In the figures.

DETAILED DESCRIPTION

Figure 1:
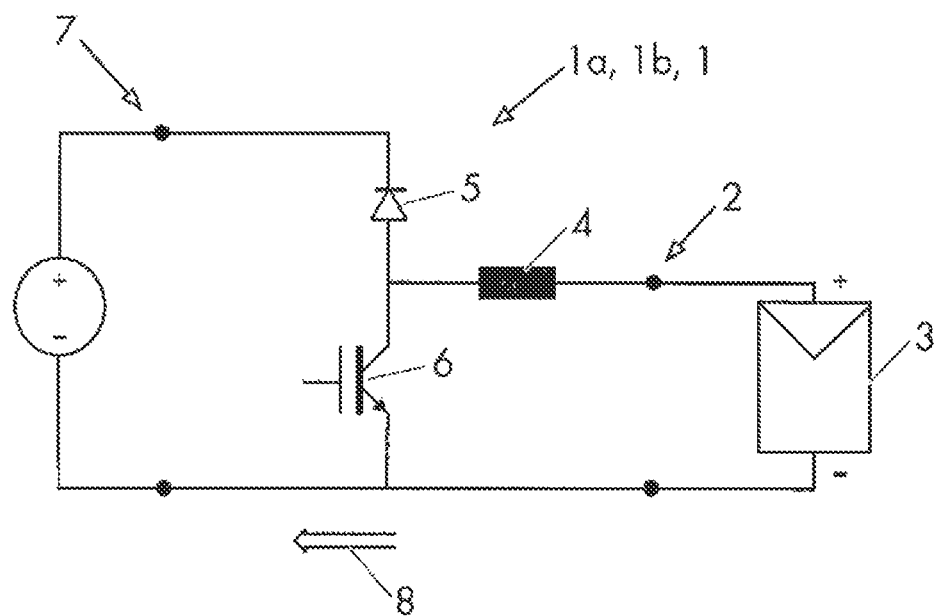
FIG. 1 schematically shows a boost converter.

FIG. 1 discloses a power electronics device 1a that is a power converter 1b in the form of a boost converter 1 in a schematic illustration, with details such as, for example, a housing of the boost converter 1 not being illustrated for the sake of clarity. A DC voltage generator 3, which provides a DC voltage, is connected to an input 2 of the boost converter 1. The boost converter 1 comprises a choke 4, a diode 5 and a power semiconductor switch 6. In order to convert the DC voltage present at the input 2 into a higher DC voltage to be provided at the output 7, the power semiconductor switch 6 is driven by a driver circuit (not illustrated) and switched accordingly, so as to give rise to an electrical energy flow in the direction of the arrow 8.

Figure 2:
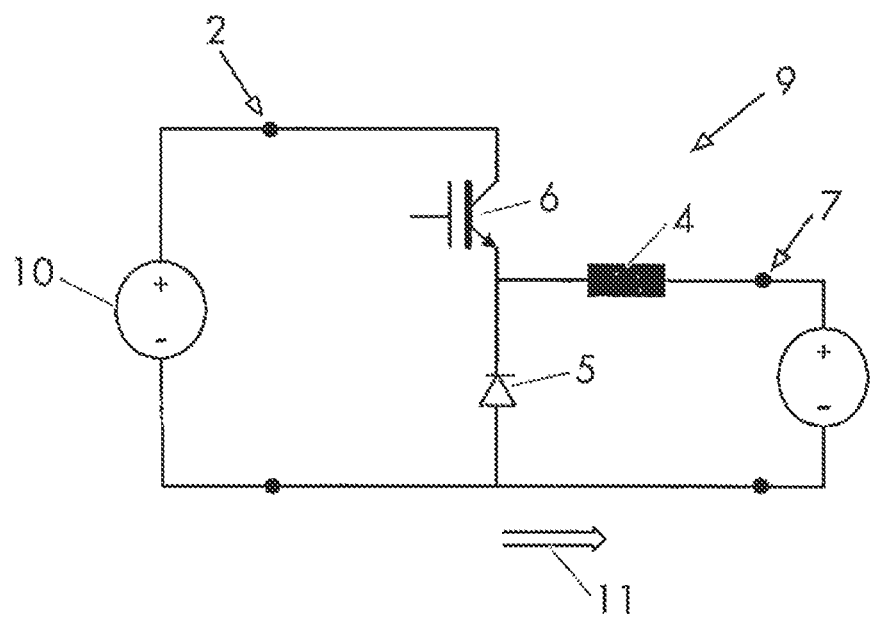
FIG. 2 schematically shows a buck converter.

FIG. 2 discloses a power converter in the form of a buck converter 9 in a schematic illustration. A DC voltage source 10 is connected to an input 2 of the buck converter. The buck converter 9 comprises a power semiconductor switch 6, a diode 5 and a choke 4. In order to convert the DC voltage present at the input 2 into a lower DC voltage to be provided at the output 7, the power semiconductor switch 6 is driven by a driver circuit (not illustrated) and switched accordingly, so as to give rise to an electrical energy flow in the direction of the arrow 11.

Figure 3:
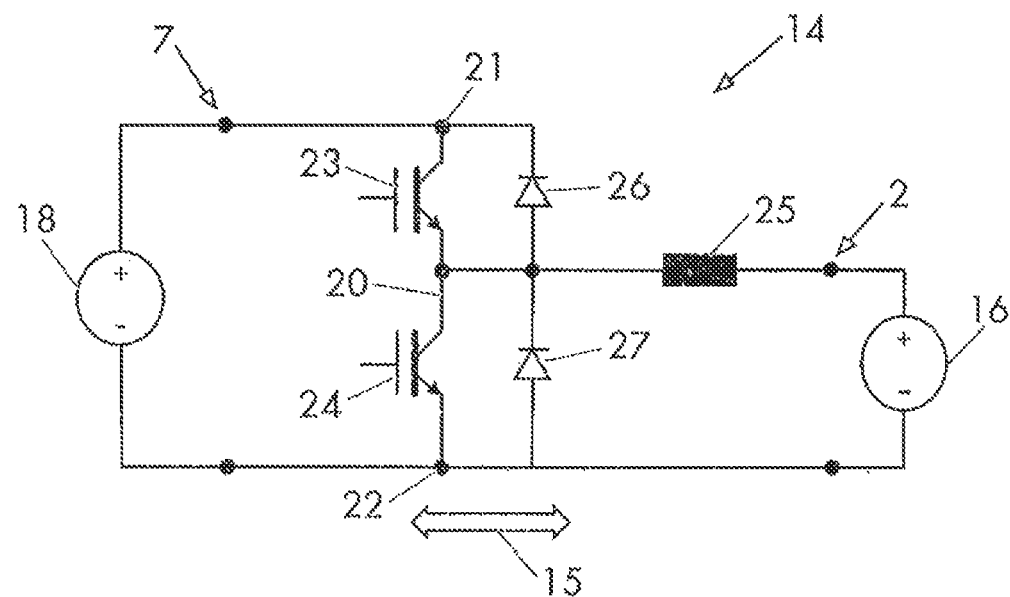
FIG. 3 schematically shows a half-bridge arrangement.

FIG. 3 shows a power converter in the form of a half-bridge arrangement 14 in a schematic illustration. A DC voltage is able to be set bidirectionally by way of the half-bridge arrangement 14, such that an electrical energy flow is made possible in both directions of the double-headed arrow 15. For this reason, the designation of the input 2 and of the output 7 of the power converter in the figure is chosen arbitrarily. A DC voltage source 16 is connected to the input 2 and may be, for example, a battery that is able to be operated both as a DC voltage source and as a load. A DC voltage source 18 is connected to the output 7 and may be, for example, a link circuit of an inverter, which may be connected to a solar installation (not illustrated) on the DC side and to an AC voltage grid (not illustrated) on the AC side. In order to set the DC voltage, the half-bridge arrangement 14 comprises a half-bridge 20, which extends from a connection point 21 to a connection point 22, and a choke 25. The half-bridge 20 comprises a series connection of a high-side power semiconductor switch 23 and a low-side power semiconductor switch 24. The high-side power semiconductor switch 23 comprises a diode 26 and the low-side power semiconductor switch 24 comprises a diode 27. In order to set the DC voltage, the two power semiconductor switches of the half-bridge 20 are each driven at their control inputs by a driver circuit (not illustrated), such that, when required, an electrical energy flow is created in one of the two directions of the double-headed arrow 15.

Figure 4:
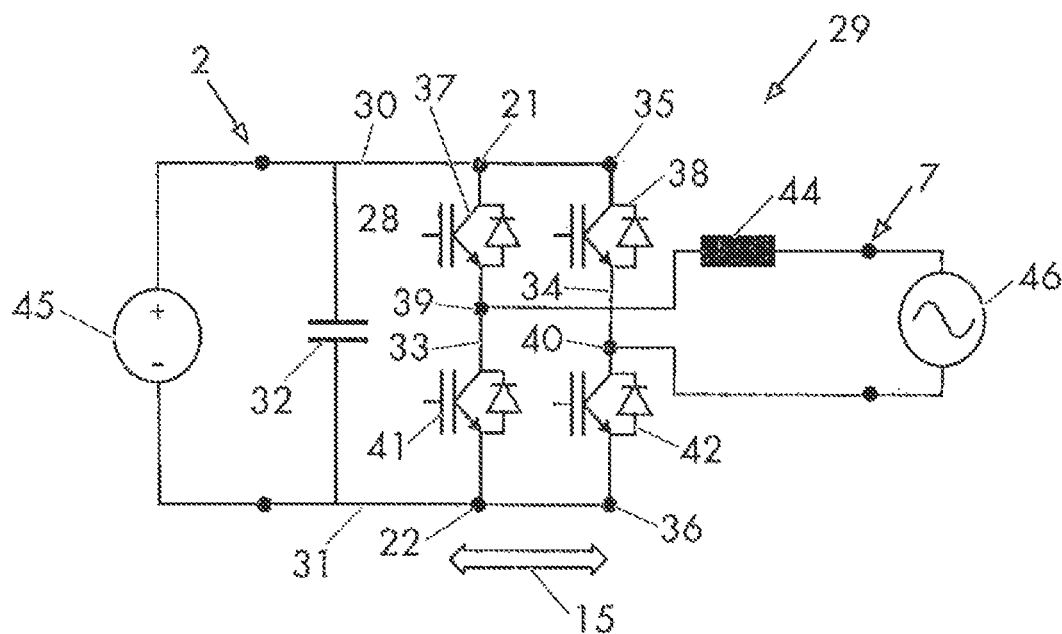
FIG. 4 schematically shows an inverter.

FIG. 4 shows an inverter 29 in a schematic illustration. A DC voltage is able to be converted into an AC voltage and vice versa by way of the inverter 29, such that an electrical energy flow is made possible in the direction of the double-headed arrow 15. For this reason, the designation of the input 2 and of the output 7 of the power converter in the figure is chosen arbitrarily. The inverter 29 comprises a link circuit 28 with a first link circuit pole 30 and a second link circuit pole 31, which are connected to one another via a link circuit capacitor 32. The inverter 29 comprises two half-bridges 33 and 34, which extend between a connection point 21 or 35 connected to the first link circuit pole 30 and a connection point 22 or 36 connected to the second link circuit pole 31, and, starting from the connection point 21 or 35, each comprise a series connection consisting of a high-side power semiconductor switch 37 or 38, a branch point 39 or 40 and a low-side power semiconductor switch 41 or 42. The branch point 39 has a choke 44 connected downstream thereof in the direction of the output 7. A DC voltage generator 45 is connected to the input 2 of the inverter 29 and an AC voltage grid 46 is connected to the output 7 of the inverter 29. In order to set the electrical voltage, driver circuits (not illustrated) for driving and switching the power semiconductor switches are arranged such that, when required, an electrical energy flow is made possible in both directions of the double-headed arrow 15.

Figure 5:
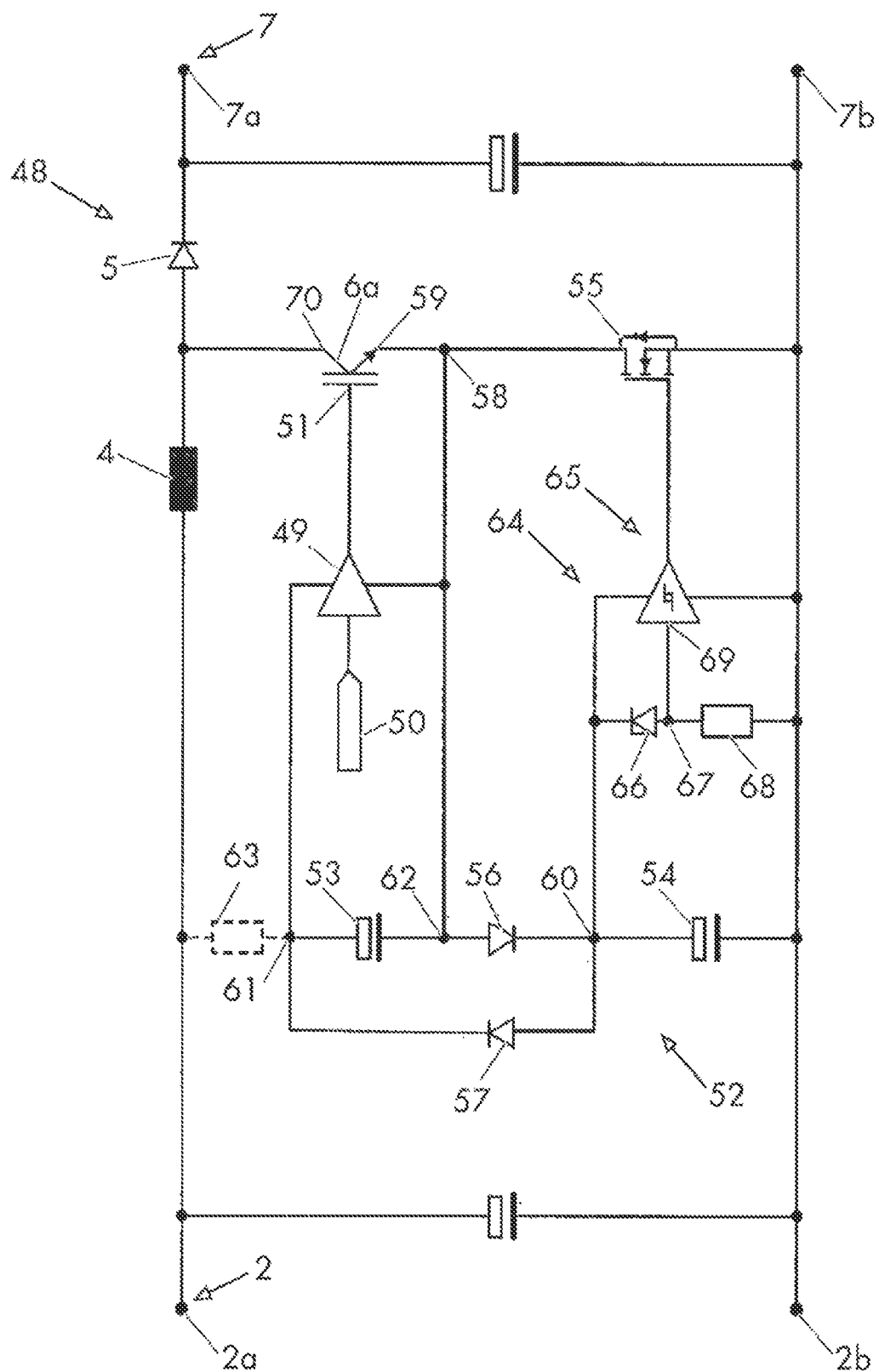
FIG. 5 schematically shows a boost converter according to an embodiment of the disclosure, FIG. 6 schematically shows a half-bridge arrangement according to an embodiment of the disclosure, FIG. 7 schematically shows a half-bridge arrangement according to an embodiment of the disclosure.

FIG. 5 shows a power converter in the form of a boost converter 48 according to an embodiment of the disclosure in a schematic illustration. In order to drive a first power semiconductor switch 6a, a driver circuit 49 is connected to a control input 51 of the power semiconductor switch 6a. The driver circuit 49 is integrated in one component with a clock generator 50. In order to supply electrical voltage to the driver circuit 49, an auxiliary circuit arrangement 52 is included and comprises a supply capacitor 53, an auxiliary capacitor 54, a normally off auxiliary semiconductor switch 55, a diode 56 and a bootstrap diode 57. The auxiliary semiconductor switch 55 is connected to a reference potential connection 59 of the first power semiconductor switch 6a via a first connection point 58 and is integrated into a main circuit of the boost converter 48. Starting from the first connection point 58, a series connection of the diode 56, a second connection point 60 and the auxiliary capacitor 54 is included and is arranged in parallel with the auxiliary semiconductor switch 55. For its electrical voltage supply, the driver circuit 49 is connected to the supply capacitor 53, which is in turn electrically connected by a first connection 61 to the second connection point 60 via the bootstrap diode 57 and by a second connection 62 to the reference potential connection 59.

The auxiliary circuit arrangement 52 additionally comprises a drive circuit 64 that is configured as a comparator circuit 65 for driving the auxiliary semiconductor switch 55. This is connected in parallel with the auxiliary capacitor 54 at two supply connections. In addition, a series connection of a Zener diode 66 in the reverse direction, an eighth connection point 67 and a resistor 68 is arranged in parallel with the auxiliary capacitor 54, wherein the non-inverting input 69 of the comparator circuit 65 is connected to the eighth connection point 67 and the inverting input (not illustrated) of the comparator circuit 65 is connected to a reference potential (not illustrated).

Both during operation and upon startup of the boost converter 48, its necessary components, for example, the driver circuit 49, have to be supplied with electric power. Upon startup, for example, a DC voltage may be applied at least between a first connection 2a and a second connection 2b of the input 2 of the boost converter 48, this being provided, for example, by a DC generator (not illustrated). Thus, upon startup, a DC voltage is applied between the reference potential connection 59 of the first power semiconductor switch 6a and a further main connection 70, which DC voltage leads to a leakage current through the first power semiconductor switch 6a such that, when the auxiliary semiconductor switch 55 is in the off state, the auxiliary capacitor 54 is charged by the flow of current through the first power semiconductor switch 6a. If the charge of the auxiliary capacitor 54 exceeds a first threshold value, the comparator circuit 65 provides a control signal at the control input of the auxiliary semiconductor switch 55 that puts the switch into the on state, such that, when the auxiliary semiconductor switch 55 is in the on state and the auxiliary capacitor 54 is at least partially charged, the supply capacitor 53 is charged by the auxiliary capacitor 54 via the bootstrap diode 57. In this case, the charge of the auxiliary capacitor 54 drops below a second threshold value, such that the comparator circuit 65 no longer provides a control signal at the control input of the auxiliary semiconductor switch 55 and the auxiliary semiconductor switch 55 switches back to an off switching state again and the auxiliary capacitor 54 is recharged. During operation of the boost converter 48, an operating current flows through the first power semiconductor switch 6a, such that, by repeating the charging process multiple times, electric power is supplied to the supply capacitor 53 in order to supply the driver circuit 49 during operation. To shorten the startup time, a startup resistor 63 may optionally be arranged that electrically connects the first connection 2a of the input to the first connection 61 of the supply capacitor 53.

Figure 6:
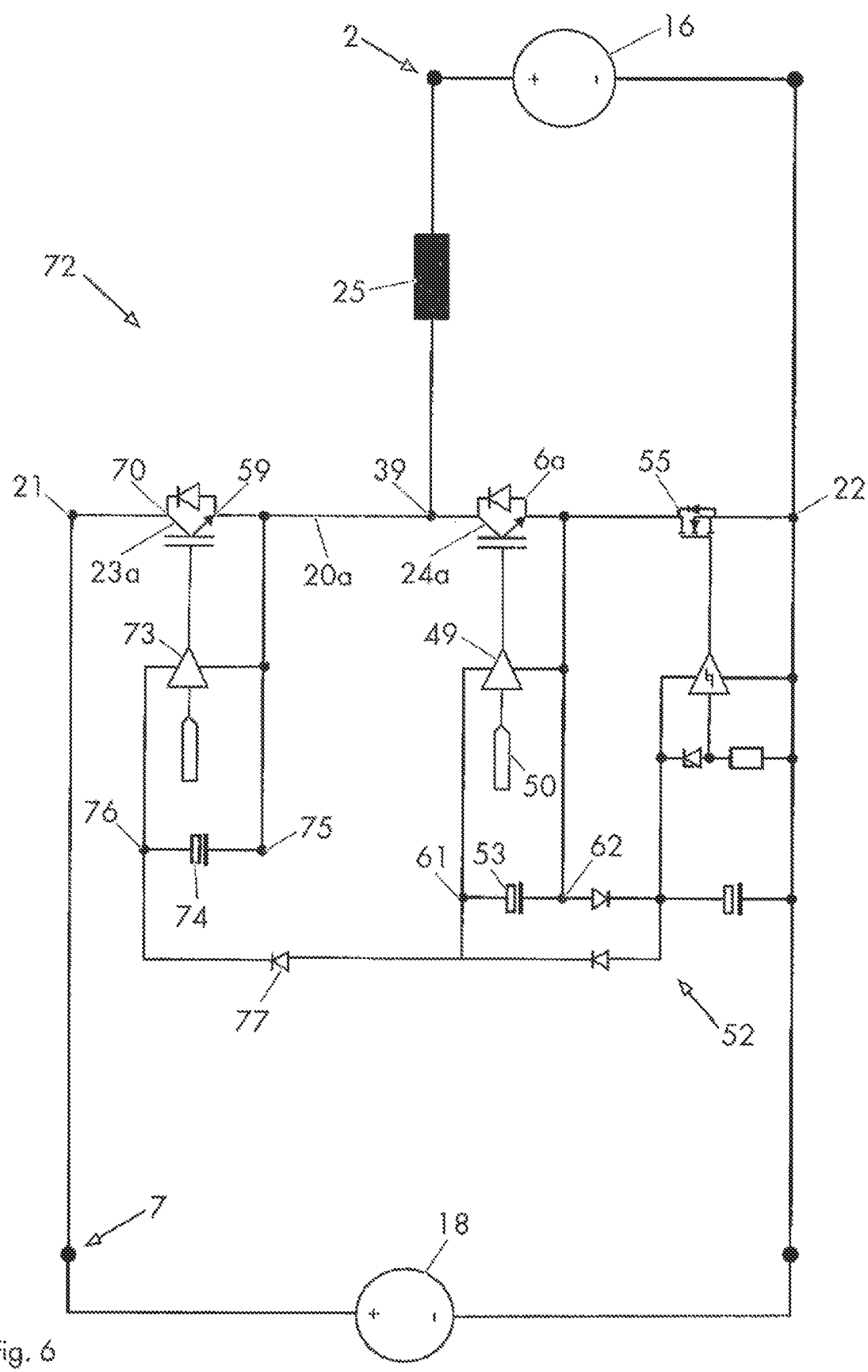

FIG. 6 shows a half-bridge arrangement 72 according to another embodiment of the disclosure in a schematic illustration. The differences between the half-bridge arrangement 72 illustrated in FIG. 6 and the half-bridge arrangement 14 from the prior art illustrated in FIG. 3 will essentially be discussed in the following. The half-bridge 20a of the half-bridge arrangement 72, which extends between the connection points 21 and 22, likewise comprises, starting from the connection point 21, a series connection comprising a high-side power semiconductor switch 23a, a branch point 39 and a low-side power semiconductor switch 24a, wherein, in the illustrated embodiment, the two power semiconductor switches each have an integrated body diode and an auxiliary semiconductor switch 55 is integrated into the half-bridge 20a. In order to supply the driver circuit 49 of the low-side power semiconductor switch 24a, the latter is designed as a first power semiconductor switch, such that a driver circuit 49 for driving the low-side power semiconductor switch 24a is supplied with electrical voltage by way of an auxiliary circuit arrangement 52 comprising the auxiliary semiconductor switch 55. With regard to the auxiliary circuit arrangement 52, reference is made to the description of the circuit in FIG. 5. In order to drive the high-side power semiconductor switch 23a, the half-bridge arrangement 72 has a driver circuit 73 that is electrically connected to a supply capacitor 74 for its electrical voltage supply. In order to charge the supply capacitor 74 for the supply of electrical voltage to the driver circuit 73 for driving the high-side power semiconductor switch 23a, the latter is electrically connected by a connection 75 to a reference potential connection 59 of the high-side power semiconductor switch 23a and by a further connection 76 to the first connection 61 of the supply capacitor 53 included in the auxiliary circuit arrangement 52 via a further bootstrap diode 77. Thus, in the illustrated embodiment, the driver circuit 73 for driving the high-side power semiconductor switch 23a may likewise be supplied with electric power in an energy-efficient manner during operation of the half-bridge arrangement 72.

Figure 7:
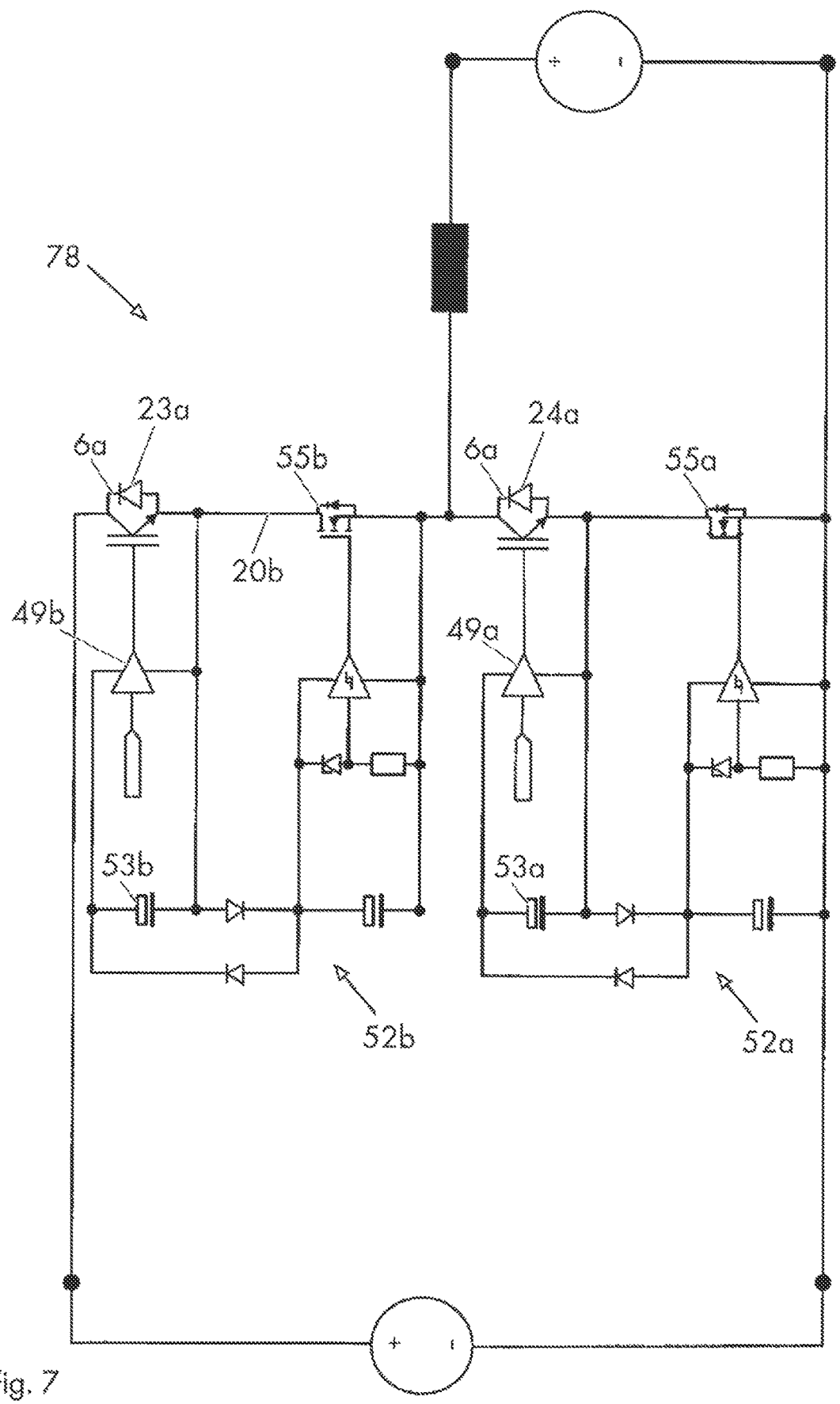

FIG. 7 shows a half-bridge arrangement 78 according to another embodiment of the disclosure in a schematic illustration. In contrast to the embodiment of FIG. 6, an alternative supply of electrical voltage to the driver circuit of the high-side power semiconductor switch 23a is illustrated. For this purpose, both the high-side power semiconductor switch 23a and the low-side power semiconductor switch 24a are each configured as a first power semiconductor switch. Both driver circuits 49a, 49b for driving the high-side and low-side power semiconductor switches 23a, 24a are thus supplied with electrical voltage via a separate auxiliary circuit arrangement 52a, 52b. This alternative embodiment thus likewise enables an energy-efficient supply of electrical voltage to the driver circuits for driving the two power semiconductor switches for startup and during operation of the half-bridge arrangement 78. The electrical voltage supply to the driver circuits in FIG. 6 and FIG. 7 may also be transferred to power electronics devices with more than one half-bridge, for example, in the case of single-phase or three-phase inverters with a correspondingly designed inverter bridge.

Figure 8:
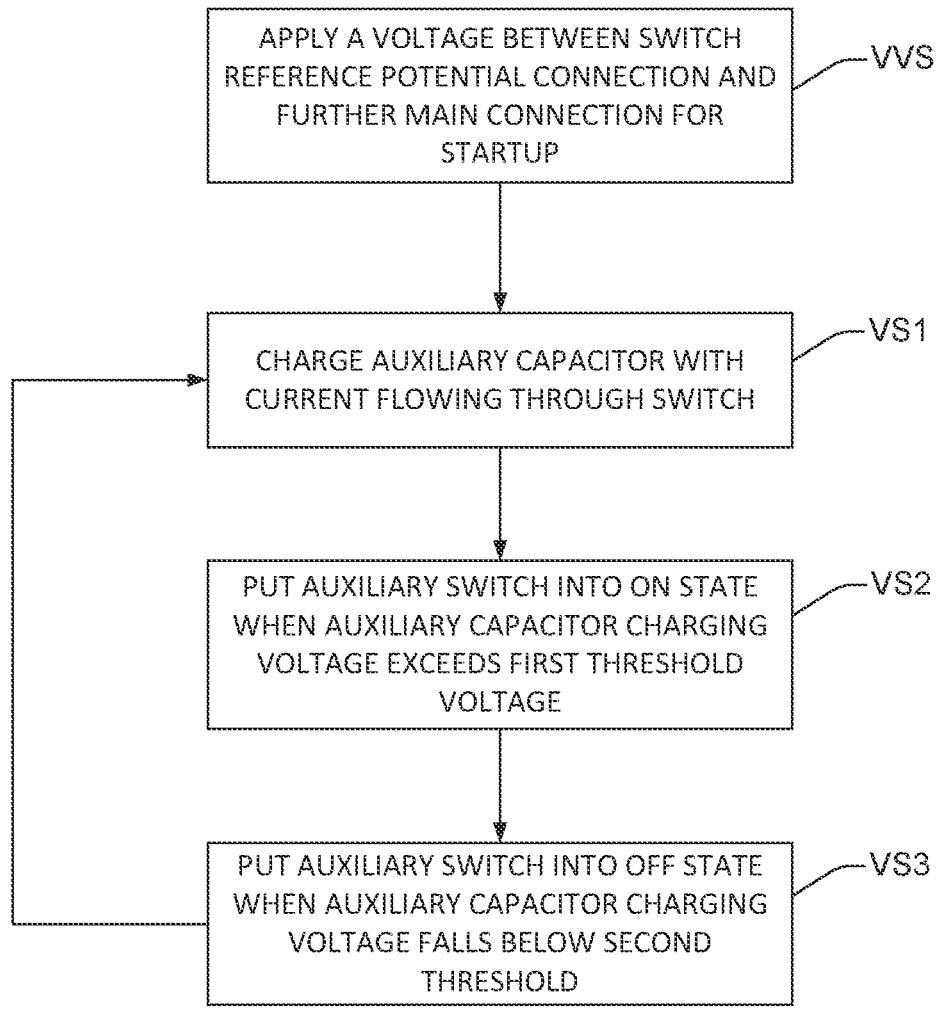
FIG. 8 shows a flowchart of a method according to an embodiment of the disclosure.

FIG. 8 shows a flowchart of a method for supplying electrical voltage to a driver circuit of a power semiconductor switch according to another embodiment of the disclosure. In the method, in a preparatory act VVS, a voltage is first of all applied between a reference potential connection of the power semiconductor switch and a further main connection of the power semiconductor switch for a startup. In a first method act VS1, an auxiliary capacitor is charged by way of at least part of a current flowing through the power semiconductor switch, while a normally off auxiliary switch is in an off switching state. In a second method act VS2, the auxiliary switch is put into the on state when a first threshold value of the charging voltage of the auxiliary capacitor is exceeded and at least part of the charge of the auxiliary capacitor is released to a supply capacitor for the supply of electrical voltage to the driver circuit. In a third method act VS3, the auxiliary switch is put back into an off switching state when a second, lower threshold value of the charging voltage of the auxiliary capacitor is fallen below, wherein electric power is supplied to the supply capacitor by repeating the three acts VS1-VS3 multiple times in order to supply the driver circuit during operation of the power semiconductor switch.

The invention claimed is:

1. A power electronics device, comprising:
a first power semiconductor switch,
a driver circuit configured to drive the first power semiconductor switch, and
an electrical auxiliary circuit arrangement configured to supply electrical voltage to the driver circuit, wherein the auxiliary circuit arrangement comprises:
a supply capacitor,
an auxiliary capacitor,
a normally off auxiliary semiconductor switch, and
a diode and a bootstrap diode,
wherein the auxiliary semiconductor switch is connected to a reference potential connection of the first power semiconductor switch via a first connection point,
wherein, starting from the first connection point, a series connection of the diode, a second connection point and the auxiliary capacitor is arranged in parallel with the auxiliary semiconductor switch such that, when the auxiliary semiconductor switch is in the off state, the auxiliary capacitor is charged by the flow of current through the first power semiconductor switch,
wherein the driver circuit is connected to the supply capacitor for its electrical voltage supply, and
wherein the supply capacitor is electrically connected by a first connection to the second connection point via the bootstrap diode and by a second connection to the reference potential connection, such that, when the auxiliary semiconductor switch is in the on state and the auxiliary capacitor is at least partially charged, the supply capacitor is charged by the auxiliary capacitor via the bootstrap diode.

2. The power electronics device as claimed in claim 1, wherein the auxiliary circuit arrangement comprises a drive circuit configured to provide a control signal for switching the auxiliary semiconductor switch at a control input of the auxiliary semiconductor switch based on a charging voltage of the auxiliary capacitor.

3. The power electronics device as claimed in claim 2, wherein the drive circuit is configured to provide the control signal that puts the auxiliary semiconductor switch into the on state at the control input of the auxiliary semiconductor switch when a charging voltage of the auxiliary capacitor exceeds a first threshold value, and to provide the control signal that puts the auxiliary semiconductor switch into the off state at the control input of the auxiliary semiconductor switch when the charging voltage of the auxiliary capacitor falls below a second threshold value that is lower than the first threshold value, wherein the first threshold value corresponds at least to a magnitude of a supply voltage to the driver circuit.

4. The power electronics device as claimed in claim 2, wherein the drive circuit comprises a two-level regulator, a comparator circuit, a monoflop, a PWM controller, or a frequency controller.

5. The power electronics device as claimed in claim 2, wherein the drive circuit is electrically connected to the auxiliary capacitor such that the drive circuit is supplied electrical with the electrical voltage by way of the auxiliary capacitor.

6. The power electronics device as claimed in claim 1, wherein the auxiliary semiconductor switch has the same polarity as the first power semiconductor switch.

7. The power electronics device as claimed in claim 1, wherein the first power semiconductor switch is configured to be normally off and, in the off switching state, has a leakage current when an electrical voltage is applied between the reference potential connection and a further main connection of the first power semiconductor switch.

8. The power electronics device as claimed in claim 1, wherein the auxiliary semiconductor switch is configured to supply at least one driver circuit.

9. The power electronics device as claimed in claim 1, wherein the driver circuit is integrated with a clock generator, wherein the clock generator is configured to generate a pulse pattern of the control signal provided by the driver circuit.

10. The power electronics device as claimed in claim 1, further comprising a half-bridge that, starting from a third connection point, comprises a series connection comprising:
 a high-side power semiconductor switch,
 a branch point,
 a low-side power semiconductor switch, and
 a fourth connection point,
wherein the first power semiconductor switch is the low-side power semiconductor switch, and wherein the power electronics device comprises a DC/DC converter or an inverter.

11. The power electronics device as claimed in claim 10, further comprising a link circuit having an electrical connection connecting the third connection point to the fourth connection point via one or more series-connected or parallel-connected link circuit capacitors.

12. The power electronics device as claimed in claim 10, wherein the first power semiconductor switch comprises the high-side power semiconductor switch and the low-side power semiconductor switch, each high-side power semiconductor switch and low-side power semiconductor switch driven by respective driver circuits, wherein each respective driver circuits are supplied with electrical voltage by respective separate electrical auxiliary circuit arrangements.

13. The power electronics device as claimed in claim 10, further comprising a driver circuit configured to drive the high-side power semiconductor switch and a supply capacitor for electrical voltage supply of the driver circuit of the high-side power semiconductor switch, wherein the the supply capacitor for the driver circuit of the high-side power semiconductor switch is electrically connected by a connection to a reference potential connection of the high-side power semiconductor switch and is electrically connected by a further connection to the first connection of the supply capacitor included in the auxiliary circuit arrangement via a further bootstrap diode in order to supply electrical voltage to the driver circuit for driving the low-side power semiconductor switch.

14. The power electronics device as claimed in claim 10, wherein the high-side power semiconductor switch and the low-side power semiconductor switch are normally off and, in the off switching state, have a leakage current when an electrical voltage is applied between their reference potential connection and their further main connection.

15. A method for supplying electrical voltage to a driver circuit of a power semiconductor switch, comprising:
 charging an auxiliary capacitor with a current flowing through the power semiconductor switch during an off switching state of a normally off auxiliary switch,
 charging a supply capacitor by the auxiliary capacitor when the normally off auxiliary switch is in an on state, and
 supply,
 wherein the auxiliary switch is put into the on state based on a charging voltage of the auxiliary capacitor, wherein the auxiliary switch is put into the on state when a charging voltage of the auxiliary capacitor exceeds a first threshold value and the auxiliary switch is put into the off state when the charging voltage of the auxiliary capacitor falls below a second threshold value, wherein the second threshold value is lower than the first threshold value.

16. The method as claimed in claim 15, wherein the normally off auxiliary switch is connected to a reference potential connection of the power semiconductor, such that, in a first act, when the auxiliary switch is in the off state, at least part of the current flowing through the power semiconductor switch is diverted to the auxiliary capacitor and at least partially charges the auxiliary capacitor, wherein, in a second act, the auxiliary switch is put into the on state and releases at least part of the charge of the auxiliary capacitor to the supply capacitor, and, in a third act, the auxiliary switch is put back into an off switching state, such that electric power is supplied to the supply capacitor by repeating the three acts multiple times, in order to supply the driver circuit during operation.

17. The method as claimed in claim 15, wherein the method is performed using a power electronics device, wherein the power electronics device comprises:
 the power semiconductor switch,
 the driver circuit configured to drive the power semiconductor switch, and
 an electrical auxiliary circuit arrangement configured to supply electrical voltage to the driver circuit, wherein the auxiliary circuit arrangement comprises:
 the supply capacitor,
 the auxiliary capacitor,
 the normally off auxiliary semiconductor switch, and
 a diode and a bootstrap diode,
 wherein the auxiliary semiconductor switch is connected to a reference potential connection of the power semiconductor switch via a first connection point, wherein, starting from the first connection point, a series connection of the diode, a second connection point and the auxiliary capacitor is arranged in parallel with the auxiliary semiconductor switch such that, when the auxiliary semiconductor switch is in the off state, the auxiliary capacitor is charged by the flow of current through the power semiconductor switch, wherein the driver circuit is connected to the supply capacitor for its electrical voltage supply, and wherein the supply capacitor is electrically connected by a first connection to the second connection point via the bootstrap diode and by a second connection to the reference potential connection, such that, when the auxiliary semiconductor switch is in the on state and the auxiliary capacitor is at least partially charged, the supply capacitor is charged by the auxiliary capacitor via the bootstrap diode.

\* \* \* \* \*